(12) United States Patent
Brubacher et al.

(10) Patent No.: US 10,175,301 B1
(45) Date of Patent: Jan. 8, 2019

(54) ENERGY MANAGED WIRELESS SENSORS (71) Applicant: BlackBerry Limited, Waterloo (CA)

(72) Inventors: Jonathan Quinn Brubacher, Waterloo (CA); Mahendra Fuleshwar Prasad, Waterloo (CA)

(73) Assignee: BlackBerry Limited, Waterloo, Ontario (CA)

( * ) Notice: Subject to any disclaimer, the term of this patent is extended or adjusted under 35 U.S.C. 154(b) by 0 days.

(21) Appl. No.: 15/827,930

(22) Filed: Nov. 30, 2017

(51) Int. Cl.
*G01R 31/36* (2006.01)

(52) U.S. Cl.
CPC ..... *G01R 31/3627* (2013.01); *G01R 31/3606* (2013.01); *G01R 31/3679* (2013.01)

(58) Field of Classification Search
CPC . G01R 31/36; G01R 31/3679; G01R 31/3606
See application file for complete search history.

(56) References Cited

U.S. PATENT DOCUMENTS

| | | | | |
|---|---|---|---|---|
| 2008/0024091 | A1* | 1/2008 | Yamazaki | H01Q 1/36 320/166 |
| 2009/0059827 | A1* | 3/2009 | Liu | H04W 76/28 370/311 |
| 2015/0257643 | A1* | 9/2015 | Watson | A61B 5/0002 600/301 |

* cited by examiner

*Primary Examiner* — Jermele M Hollington
*Assistant Examiner* — Alvaro Fortich
(74) *Attorney, Agent, or Firm* — Rowand LLP (57) ABSTRACT

A system and method manages power in a wireless micro-sensor having a self-contained energy source. The system and method identify the rated capacity of the self-contained energy course by processing an identification value of the self-contained energy source and measuring the temperature of the self-contained energy source over time. The system and method determine temperature trends, measure the depth of discharge of the self-contained energy source, and control the asynchronous transmission of the micro-sensor. The transmission occurs in response to the measured temperatures, the determined temperature trend, and the depth of discharge of the self-contained energy source.

20 Claims, 12 Drawing Sheets

ENERGY MANAGED WIRELESS SENSORS

BACKGROUND OF THE INVENTION

1. Technical Field

This disclosure is directed to wireless sensors and in particular to an energy efficient power management of wireless sensors.

2. Related Art

The demand for portable electronic devices and wireless sensors has created a need for developing compact energy storage. Designing small and efficient energy storage devices remains a challenge especially when those devices are self-contained and must deliver robust power and a maximum battery life over a wide range of operating temperatures. When an energy source is provided by a one-time battery charge, the electrochemical reactions and internal cell construction of the energy source may determine an energy budget and a discharge rate. Conventional low-power designs for energy management only provide limited point solutions and do not enable the system to adapt to its environment or its load.

DETAILED DESCRIPTION

A wireless sensor detects and measures an event or condition while adapting to internal and external conditions. Using a one-time battery charge, the wireless sensor makes dynamic tradeoffs between its communication schedule and its operating state in response to load and temperature changes. The wireless sensor adheres to an asynchronous schedule, turning on only when conditions warrant.

Figure 1:
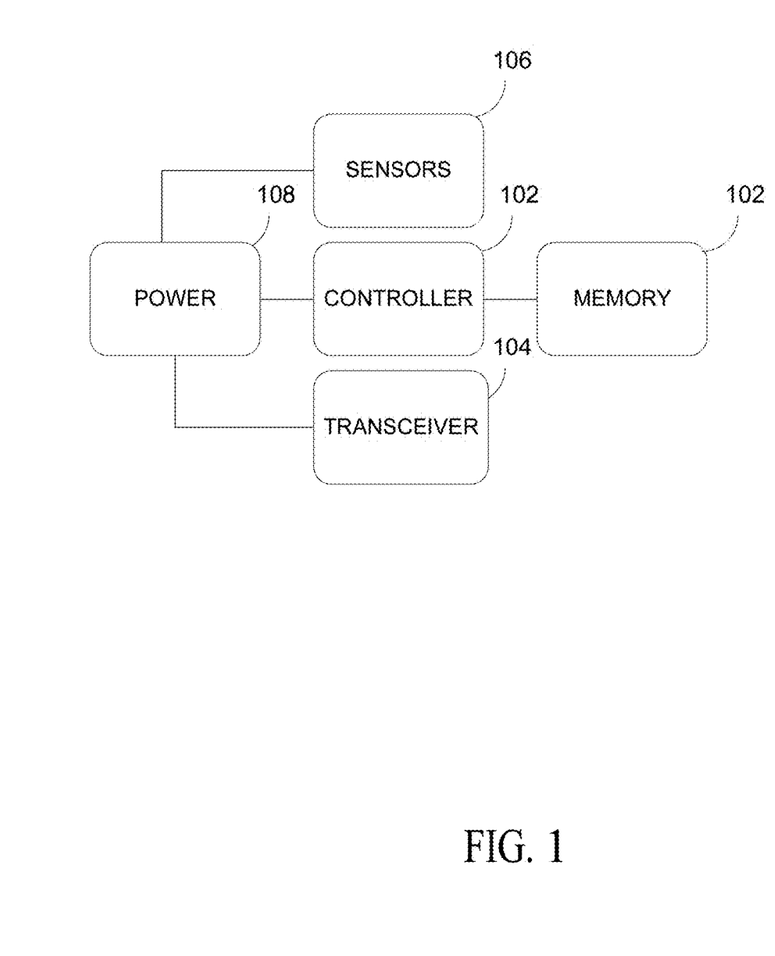
FIG. 1 is a block diagram of a representative architecture of a wireless sensor.

FIG. 1 is a block diagram of a representative architecture of a wireless sensor. The wireless sensor may comprise a self-configuring micro-sensor that has multiple subsystems. Generally, a micro-sensor refers to a small sensor that detects small amounts of a physical variable or small changes in a physical variable. A microprocessor or microcontroller and memory provide the intelligence and storage for the controller subsystem 102 of the micro-sensor. The microprocessor or microcontroller is responsible for controlling the sensor's operation, its timing, and its execution of communication protocols. A communication or transceiver subsystem 104 (hereinafter referred to as the transceiver) enables the wireless sensor to communicate with a server or a neighboring node. A node generally refers to a remote point of communication in a distributed network. In response to the microprocessor, the transceiver subsystem 104 determines the modulation schemes, data rates, and transmission power used to transmit data over a fixed or a variable distance. A sensor subsystem 106 links the wireless sensor to the physical world. The sensor subsystem may comprise one or more sensors and actuators including a global positioning sensor (GPS), a temperature sensor, an accelerometer, a speed sensor, a voltage sensor (and/or circuitry), a current sensor (and/or circuitry), etc. A power subsystem 108 supplies the power to the sensor and converts electric current from a source to a correct current level, a correct voltage level, and in some instances, to a correct frequency. In some instances, the power subsection 108 may apply a fixed current pulse to the battery to assess the battery's State of Health (SOH) and/or its Depth of Discharge (DOD).

In some systems, a dedicated Fuel Gauge or a coulomb counting circuit assesses the DOD and/or SOH of the primary battery in detail. The Fuel Gauge may reside within the battery or may couple the sensor hardware through its main circuit. In other systems, a binary monitor differentiates a good battery from a depleted battery. These systems may use fixed current pulses and voltage measurements to assess a battery's state.

Many configurations and subsystems may supply power to the sensor. When one or more one-time charged battery cells or chemical cells are used (referred to as the primary, the primary cell, or the self-contained energy source), the primary may be connected to a current buffer in parallel to form a hybrid power source. The hybrid power source may source periodic high current pulses to its load. In this configuration, a high volumetric energy density cell provides the energy density, while a current buffer provides the power density. A high volumetric energy density primary cell, such as bobbin-type configuration, may suffer from higher internal resistance compared to other rechargeable cells.

In some configurations, the current buffer may comprise a low resistant capacitor, an electrostatic capacitor, or a rechargeable cell. The primary cell may comprise batteries of any chemical makeup and/or construction. The primary cells may include electrochemical systems including lithium manganese dioxide, lithium-thionyl chloride, lithium sulfuryl chloride, lithium carbon-monofluoride, lithium iron disulfide, and/or alkaline-manganese dioxide, for example.

In operation, the power subsystem 108 sources the communication subsystem 104 asynchronously when communication initiates. When communication occurs, the hybrid power source provides a transmit power budget of short duration. When the charge is consumed, the current buffer is recharged by the primary cell. In some systems, the higher the discharge current sourced and/or the longer the discharge load period, the longer the recharge period becomes. Further, when power is reduced and is not sufficient to source the sensor architecture, the hybrid power source's voltage may fall below a minimum voltage threshold for the power subsystem/controller to function. The hybrid power source's low voltage may cause the controller 102 to reset and initiate endless reboots that results in a death spiral.

The internal resistance of a cell comprises electrical factors such as tabs, metal foil resistance, etc., for example, and electrochemical factors such as ionic conductivity, for example. At very low temperatures and/or when the primary cell is at high DOD, the internal resistance of the primary cell may increase as the electrochemical conditions change.

A higher internal resistance in the primary cell reduces the amount of usable capacity that may be extracted from the primary cell. The significance of this characteristic depends on the ability of the primary cell to operate in low temperatures and support its discharge rate. Some chemistries such as alkaline batteries have relatively low usable capacities at temperatures below zero degrees Celsius, while other chemistries such as lithium thionyl chloride batteries, for example, perform better under these conditions provided that the lithium thionyl chloride batteries' discharge rates are relatively low.

A higher internal resistance may cause a longer charge period for a current buffer. Further, the nominal voltage of some primary cell chemistries may be lower, which may result in a reduced maximum charging voltage. At very low temperatures, the current buffer may have a lower energy storage capability and a high internal resistance. Together these characteristics can lower the power capability of a hybrid power source and the sensor's subsystem capability. To mediate this condition, the wireless sensor's power management scheme may modulate the duty cycle of the wireless sensor's active state (e.g., an active mode), increase the total period of the active operating cycle, which increase energy savings of the sensor and reduce the chances of voltage brownout.

Figure 2:
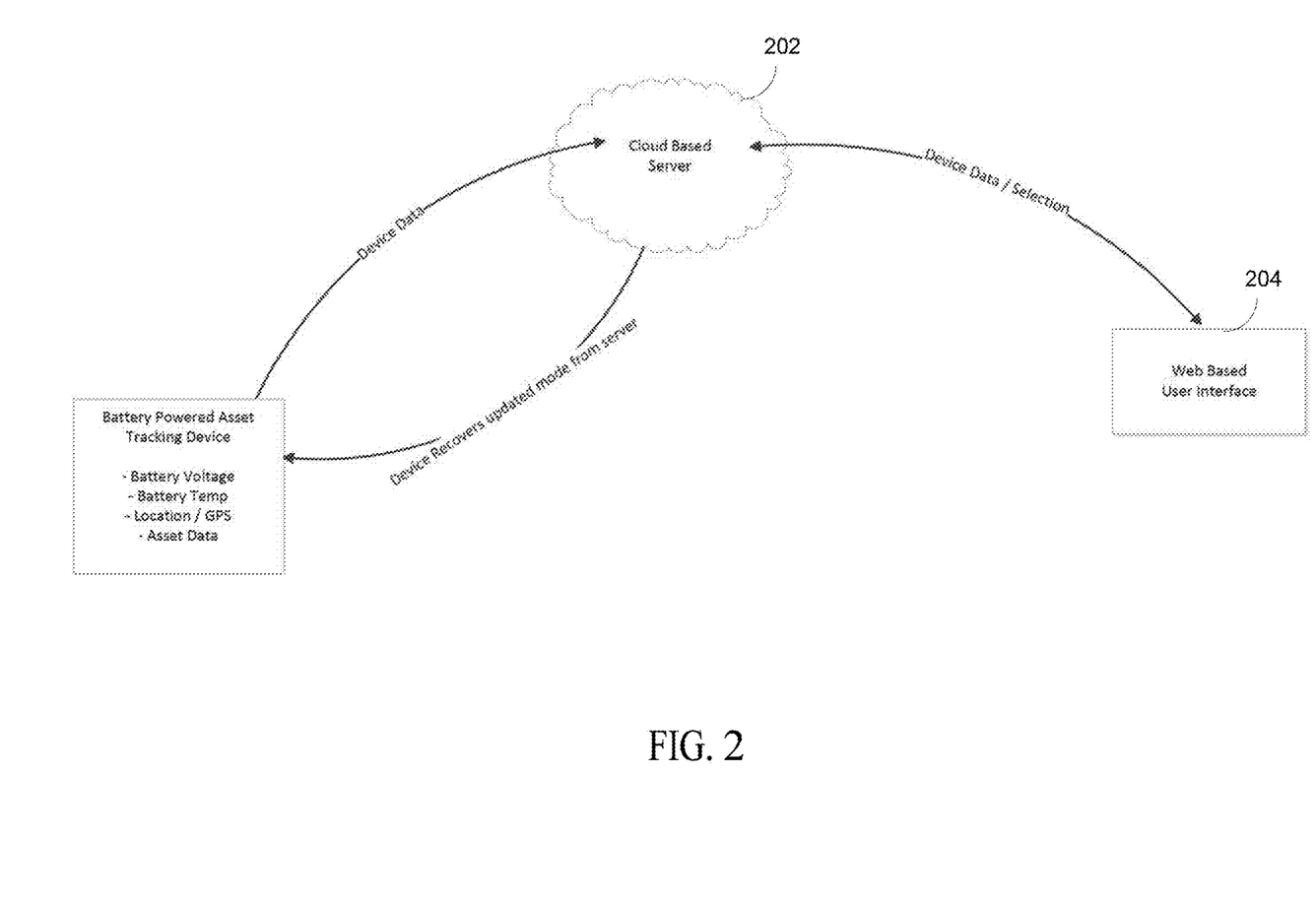
FIG. 2 shows an asset tracker in communication with a cloud-computing server.
Figure 3:
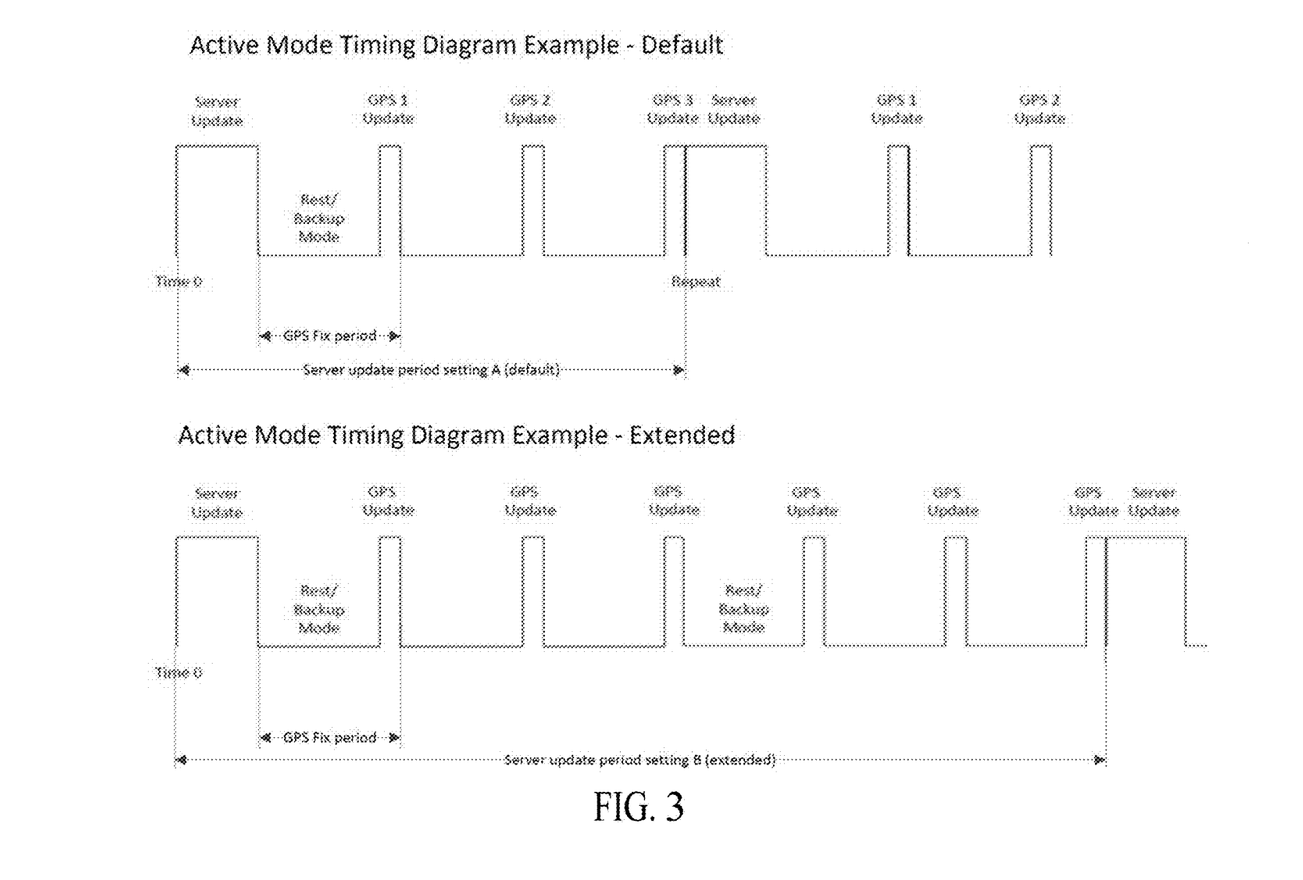
FIG. 3 is a timing diagram.

An asset tracker is representative of a wireless microsensor that may be used in a distributed network. The asset tracker has widespread applications for tracking resources (e.g., a person or thing). It attaches to or is associated with the asset and it gathers data from an internal array of sensors that may include one or more voltage sensors, current sensors, temperature sensors, radio navigation sensors, utility meters, livestock sensors, electronic toll tags, etc., for example. The monitored asset data may be collected over time and transmitted to a cloud-computing server or server cluster 202 (referred to as a server) shown in FIG. 2. The cloud-computing server 202 enables ubiquitous access to shared pools of configurable system resources and higher-level services that are rapidly provisioned. A user application 204 may access the data through the cloud-computing server 202 and provide customizable alerts and notifications to a user. In operation, the asset tracker may be active for a random or predetermined amount of time such as when the target is in motion (e.g., for a random amount of time). This is designated the "transit mode." The transit mode may source different current levels. For example, the transit mode may transmit high current data pulses to the cloud-computing server 202 using a second generation (2G), a third generation (3G), and/or a fourth generation (4G) broadband cellular protocol standard at pre-determined periods (e.g., at every 15 or 30 minutes). In addition, the transit mode may scale its transmitting power to match the estimated distance between the sensor and the cloud-computing server 202. In between the transmit pulses, the sensor subsystem may determine locations at predetermined periods as shown in FIG. 3. When at rest, in a still mode, or in a sleep mode, the asset tracker functions in a low current state, switching off some of the subsystems (e.g., a random amount of time) until it wakes up through a low power wake-up channel such as a Real-Time Clock (RTC) wakeup, for example, or upon the occurrence of a detectable event. A detectable event may be detected through motion via an accelerometer or a speed sensor, for example.

From an energy perspective, the duty cycle of the power system may be locally controlled by the wireless sensor and/or remotely controlled via the cloud-computing server 202 in response to server commands and/or operating conditions. When in a power conservation state, the wireless sensor may put some of the sensor subsystems to sleep cutting off the discharge current from the primary or reducing it to allow the current buffer to catch up from the depletion caused by a discharge. This may occur when the asset tracker is in the still mode or trending on a fixed path (e.g., traveling on a rail line or an interstate highway). The primary source's lifetime may be significantly increased if the current drawn from the primary is reduced, or in the event of a high load or overload condition, completely shut off.

The power management scheme automatically increases the amount of time between wireless sensor transmission events as shown in FIG. 3, which may include reducing the current flow to one or more of the sensor subsystems. In the asset tracking application, the reduction in current may suspend location derivations made by the GPS and/or microcontroller or suspend other subsystem functions of the wireless sensor when a high load condition is detected. A current reduction or sleep mode may occur when the primary exceeds a DOD threshold and/or the primary's temperature falls below a temperature threshold. Since wireless transmission of data accounts for a major portion of the total energy consumption of a wireless sensor and often comprises the highest peak currents consumed, when the primary exceeds a DOD threshold and/or the primary's temperature falls below a temperature threshold, the power management scheme may initiate a power conservation state. The power management scheme may cause the time between wireless sensor transmission events to increase and/or the duty cycle sourcing the communication subsystem 104 to decrease as shown in FIG. 3. When the primary falls below the DOD threshold or a second DOD threshold and/or the primary's temperature rises above the temperature threshold or a second temperature threshold, the power management scheme returns the wireless sensor to its normal operation allowing the transmission events to occur asynchronously.

Because primaries have a rated current capacity and because drawing a higher current than a rated current capacity reduces the primary's life, the power management scheme may also automatically increase the time between wireless sensor transmission events and/or reduce the duty cycle sourcing the communication subsystem when such a condition is detected initiating a power conservation state. A power conversation state may occur when the voltage sourced by power subsystem 108 falls below a load threshold. To avoid degradation, a voltage sensor or a current sensor that is part of the sensor subsystem monitors the primary voltage or voltage of the hybrid power source. To mediate an over capacity condition, current from the primary may be cutoff or reduced when the voltage falls below the minimum threshold.

Figure 4:
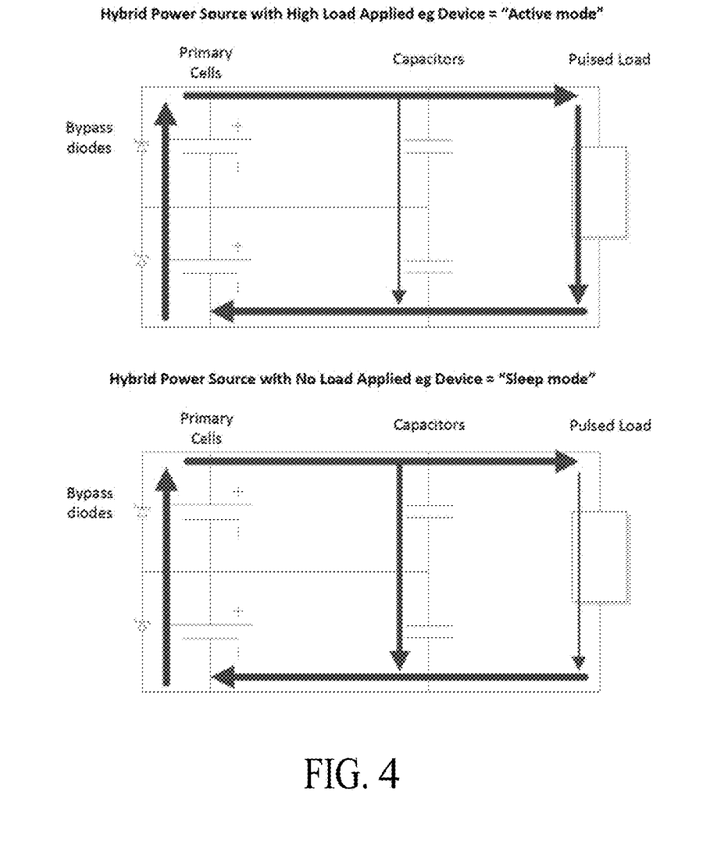
FIG. 4 shows two primaries coupled to capacitors.

FIG. 4 shows two primaries coupled to capacitors that represent a primary and a current buffer. Active mode is shown in the upper drawing by showing a larger current flowing through the load relative to the current buffer. Sleep mode is shown in the lower drawing by showing a larger current flowing into the current buffers relative to the load.

Figure 5:
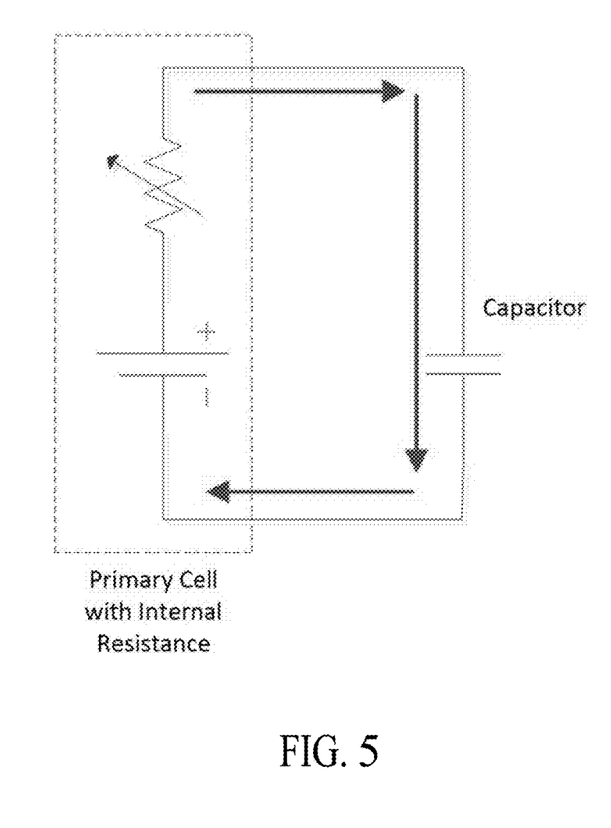
FIG. 5 shows current flow for a hybrid power source.
Figure 6:
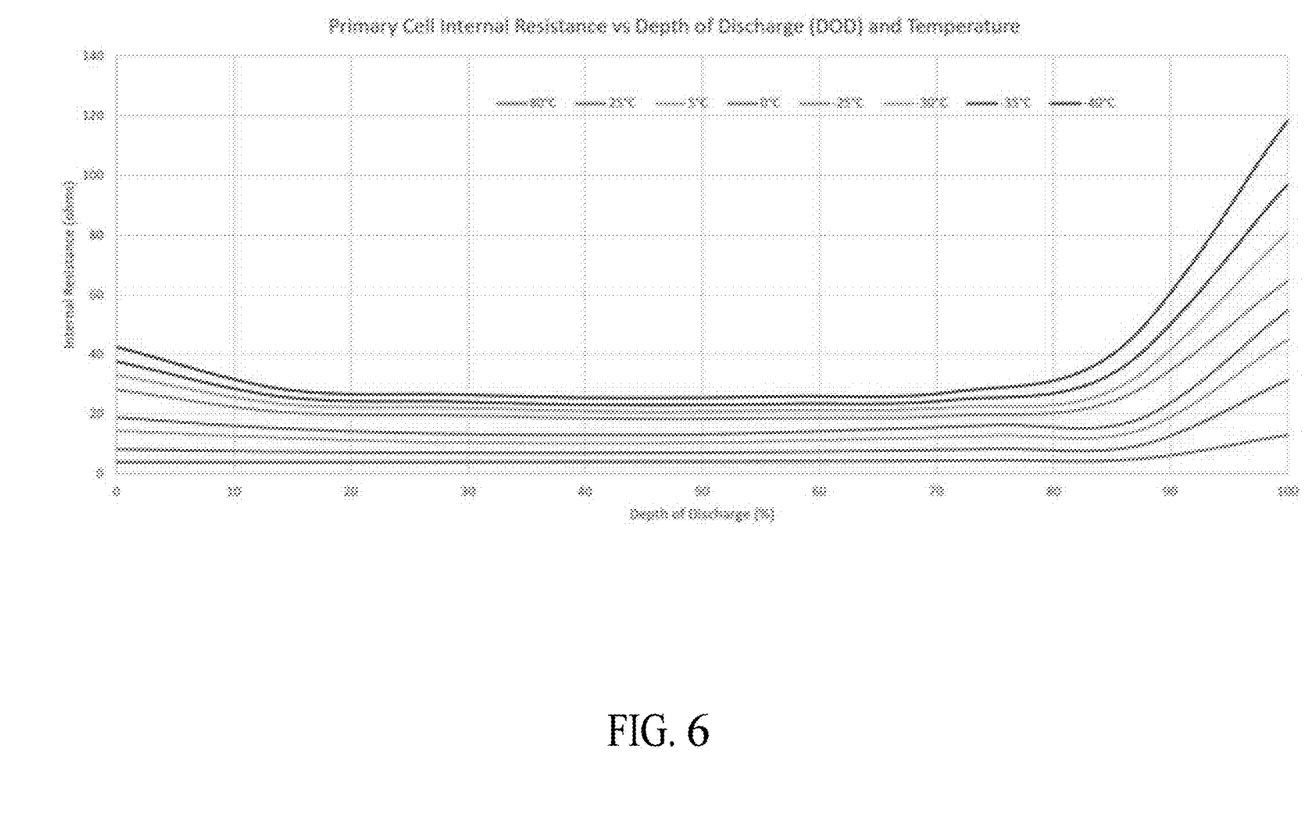
FIG. 6 is a graph of the primary's internal resistance versus temperature.

As shown in FIG. 5, a hybrid power source may be modeled as a fixed power source connected in series to an internal resistor that is connected to a capacitor. The internal resistance of the primary varies based on both temperature and DOD as shown in FIG. 6. In FIG. 6, the primary exhibits a high internal resistance at both low temperatures and a high DOD. The high internal resistance of the primary means that the temperature and load reduces the discharge current that charges the capacitor. This state causes the power management scheme to increase the wireless sensor's charge time.

Figure 7:
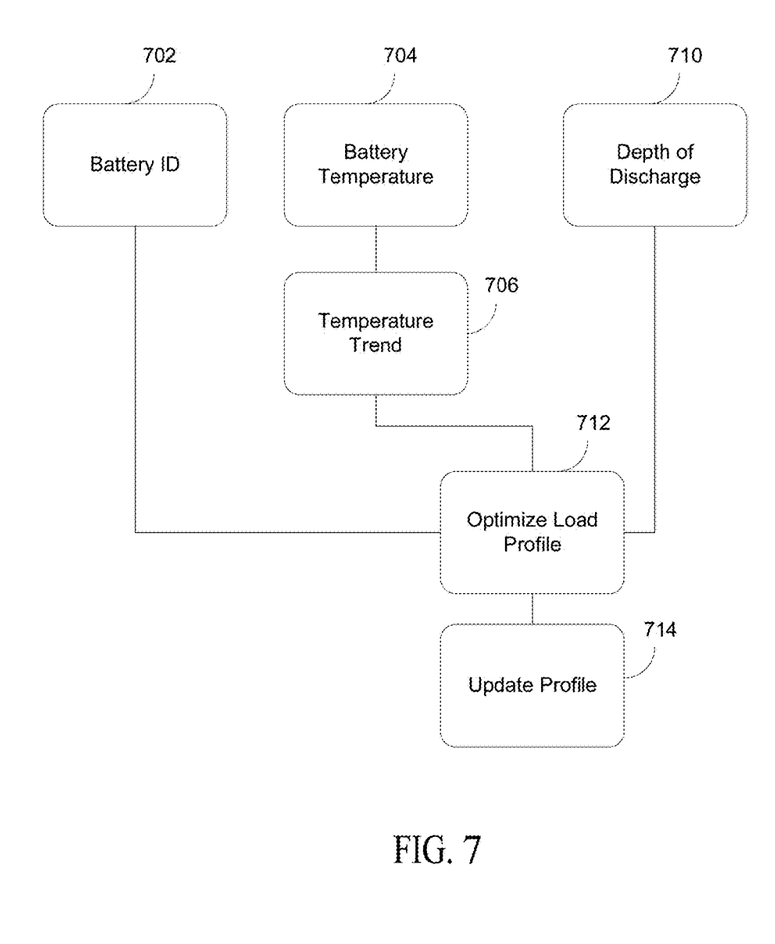
FIG. 7 shows the power management process.

FIG. 7 shows an automatic power management process that is responsive to temperature, DOD, and load. The process is executed by the wireless sensor, the cloud-computing server 202, or between them. At 702, a battery identifier identifies the battery's configuration and rated current capacity. A temperature sensor or thermistor measures the battery temperatures over time at 704 to identify the primary's temperature and its temperature trend at 706. A voltmeter, sensor, or a Fuel Gauge measures the battery state and its DOD at 710. Applying the power measurement scheme described above, a wireless sensor optimization profile is generated that controls the power subsystem operation at 712. The result may scale to the discharge rate of the primary, the amount of current drawn by hybrid source (e.g., the loading effect), the measured temperature and/or in some systems, establish the some or all of the subsystems state (active, inactive, sleep). At 714, the operating profile of the sensor's subsystem is updated.

Figure 8:
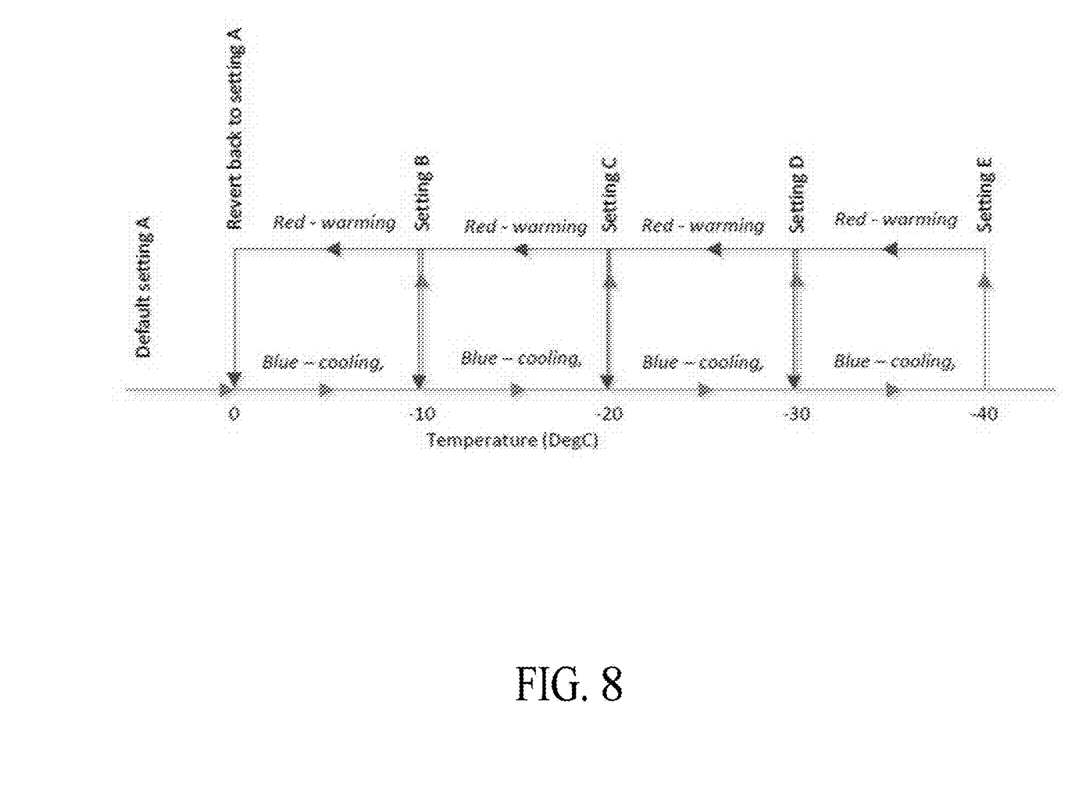
FIG. 8 shows a low temperature profile for a functioning primary.
Figure 9:
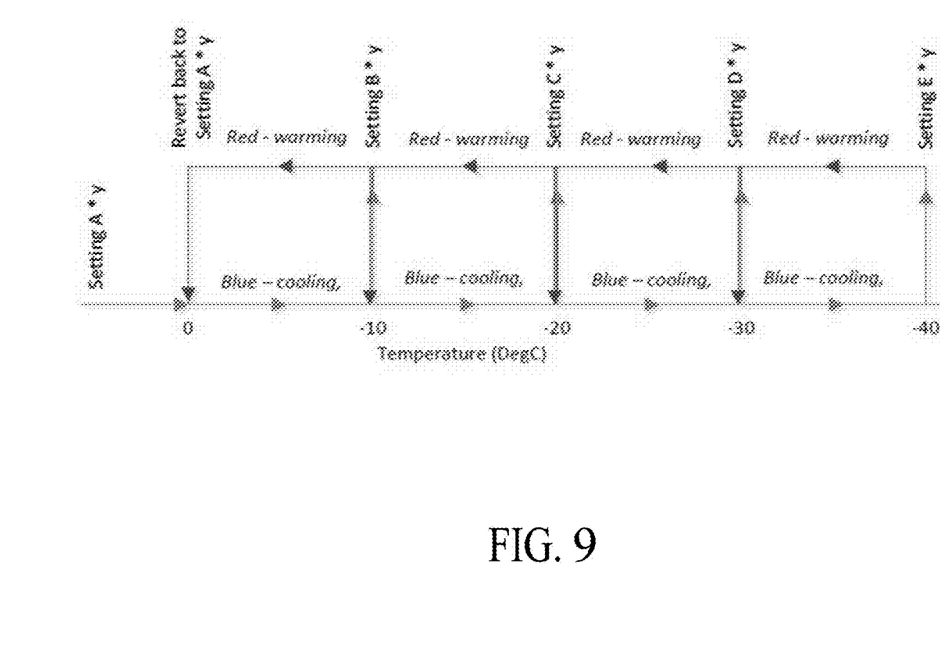
FIG. 9 shows a low temperature profile for a depleted primary.

FIG. 8 shows a low temperature profile for a fully functioning primary that is used to compare the current temperature to a previous temperature to determine a cooling versus warming trend. As shown, a hysteresis gap is applied to reduce power fluctuations at minus ten-degree intervals. In moving from right to left, the frequency of transceiver transmission is delayed or backed off via a server or sensor command (T-Mode command) to setting A, when the temperature crosses zero degrees Celsius. If cooling continues, a larger delay defined by setting C further reduces the frequency of the transceiver transmission when the temperature crosses minus twenty degrees Celsius. In some wireless sensors, the setting shown in FIG. 8 may comprise a factor that decreases the relative frequency or cadence transmission rate of the communication subsystem 104 when cooling, but increases the relative frequency or cadence transmission rate when the sensor is warming. FIG. 9 shows a low temperature profile for a degraded primary that the cloud-computing server 202 or wireless sensor may apply. The devices may process the monitored temperature to determine a cooling versus warming trend and establish the relative frequency or cadence transmission rate of the communication subsystem 104. The difference between FIGS. 8 and 9 is the adjustment factor "y" that is a multiplier that compensates for the primary's low DOD. To mitigate the loading effect, the current discharge of the primary is reduced or cutoff for a longer period allowing the primary to catch up with the depletion caused by the discharge. This process may significantly increase the primary operating life by reducing the frequency that current is drawn from the primary. This is achieved by decreasing the frequency or cadence transmission rate of the communication system 104.

Figure 10:
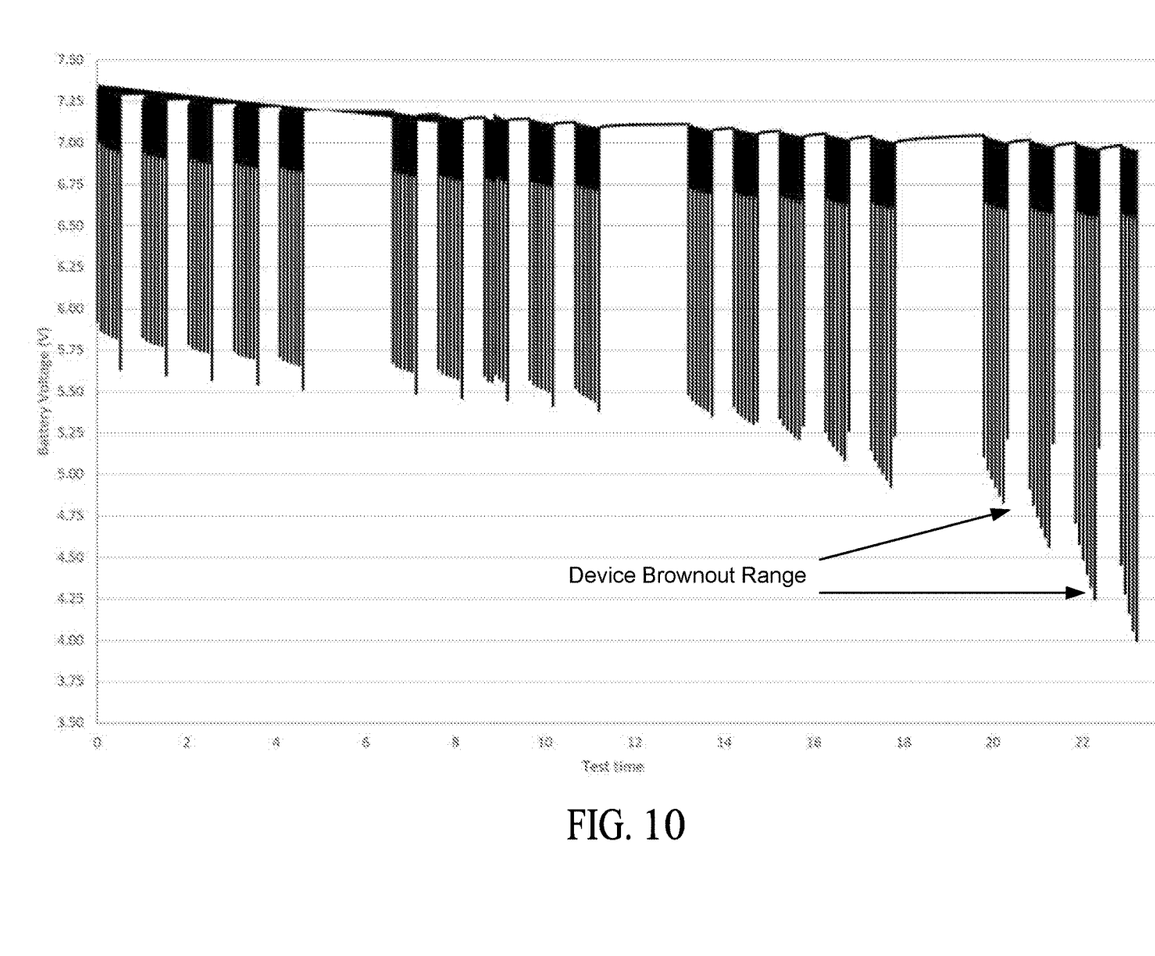
FIG. 10 shows the performance of three samples under test.
Figure 11:
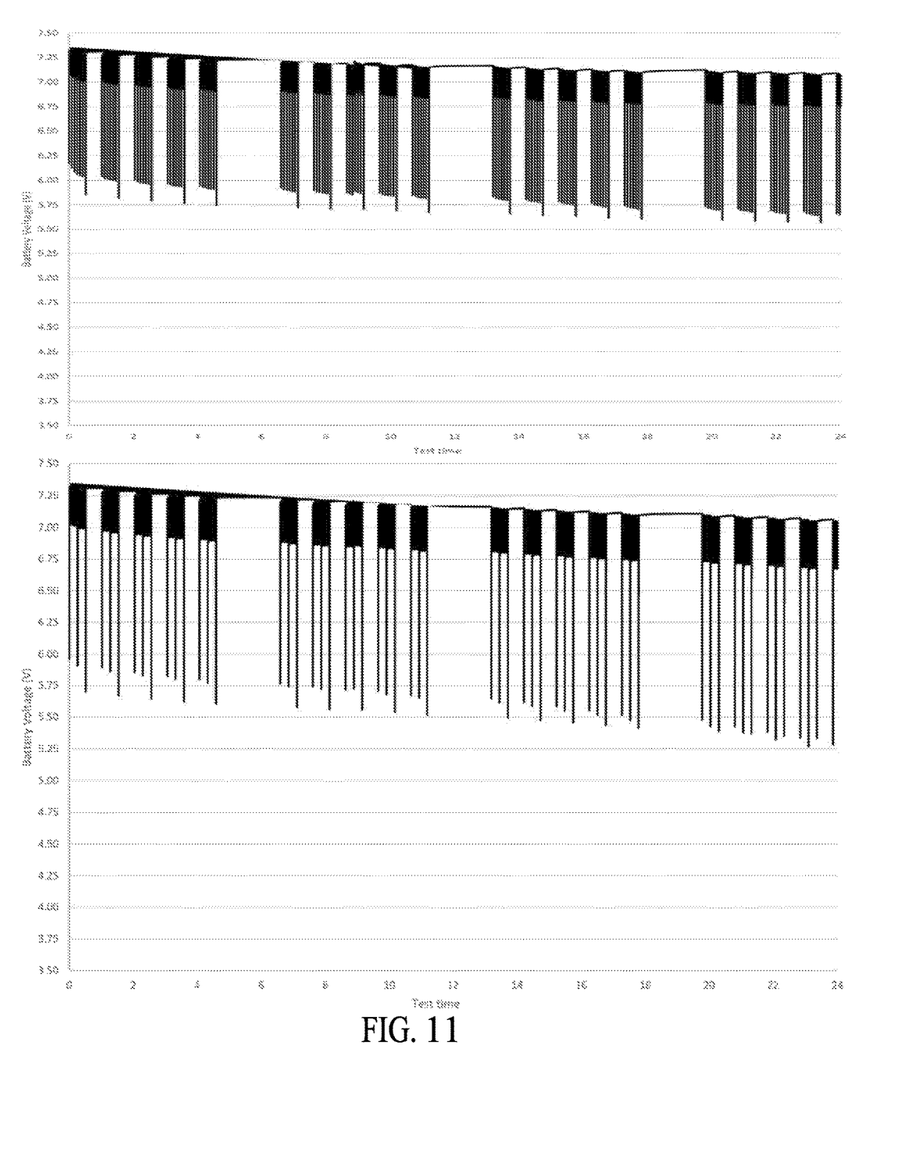
FIG. 11 shows the performance of three samples under test.

FIGS. 10 and 11 illustrate some of the benefits of the power management optimization scheme. Both figures illustrate devices operating at minus thirty-five degrees Celsius using three different battery samples. The samples were subject to an accelerated test profile at a thirty four percent-duty cycle between an active and sleep mode load simulation. The tests were run for five days in which the sensors were in active mode for eleven hours and in sleep mode for thirteen hours. The samples were also subject to two consecutive days of sleep for twenty-four hour periods. Two samples (sample one and three) operated at eighty percent of DOD, and the other sample (sample two) operated at fifty percent DOD. Sample one and two, were run on a two-hour server update schedule, while sample three was run on a six-hour server update schedule. Sample one shows a steep trend to a brownout condition starting after about two and one-half weeks, with a voltage droop around 5.30 V. After nearly four weeks, the loaded voltage on sample one fell to 4.2 V, well below the minimum input voltage required to operate the sensor. Sample two exhibited a more gradual negative trend and higher voltage droop voltage >5.55V after four weeks, which occurred at about a thirty four percent-duty cycle, and after more than eight weeks the voltage fell to about a seventeen percent duty cycle. Sample three experienced a gradual negative trend with a Vbat pulse reaching about 5.30 V after four weeks. By using the power management and optimization schemes, the slope to the brownout condition is not as steep and occurs later in time. By enabling the system to make tradeoffs between its operating state, its load condition, and/or its temperature state, the systems and processes extended the operating life of the wireless sensor.

Figure 12:
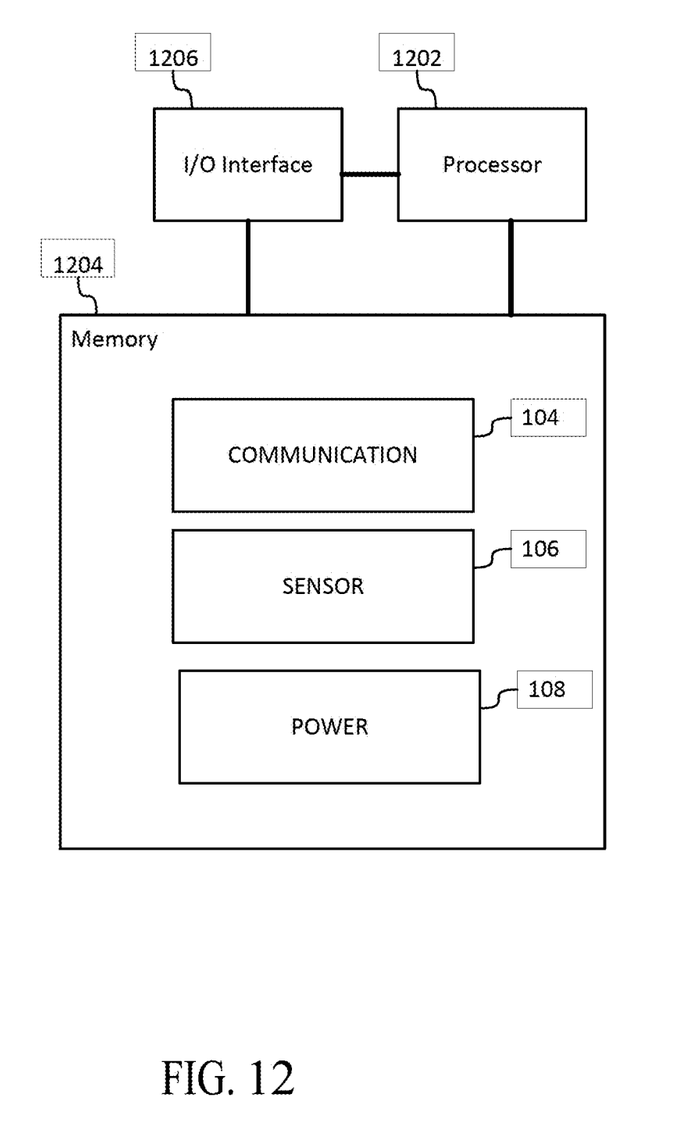
FIG. 12 is a block diagram of an energy managed wireless sensor.

FIG. 12 is an alternate block diagram of the wireless sensor. The system comprises a processor 1202, a non-transitory media such as a memory 1204 (the contents of which are accessible by the processor 1202) and an I/O interface 1206. The I/O interface 1206 communicates with local devices (e.g., routing nodes) and/or remote applications such as, for example, the cloud-computing server 202 and/or a local application 204. The memory 1204 may store instructions which when executed by the processor 1202 causes the system to render some or all of the functionality associated with the power management scheme. For example, the memory 1204 may store instructions which when executed by the processor 1202 causes the system to render the functionality associated with the communication subsystem 104, the sensor subsystem 106, and the power subsystem 108.

The processors 1202 may comprise a single processor or multiple processors that may be disposed on a single chip, on multiple devices, or distributed over more than one system. The processors 1202 may be hardware that executes computer executable instructions or computer code embodied in the memory 1204 or in other memory to perform one or more features of the systems described herein. The processor 1202 may include a central processing unit (CPU), a graphics processing unit (GPU), an application specific integrated circuit (ASIC), a digital signal processor (DSP), a field programmable gate array (FPGA), a digital circuit, an analog circuit, a microcontroller, any other type of processor, or any combination thereof.

The memory 1204 and/or storage disclosed may retain an ordered listing of executable instructions for implementing the functions described above. The machine-readable medium may selectively be, but not limited to, an electronic, a magnetic, an optical, an electromagnetic, an infrared, non-transient medium, or a semiconductor medium. A non-exhaustive list of examples of a machine-readable medium includes: a portable magnetic or optical disk, a volatile memory, such as a Random Access Memory (RAM), a Read-Only Memory (ROM), an Erasable Programmable Read-Only Memory (EPROM or Flash memory), or a database management system. The memory 1204 may comprise a single device or multiple devices that may be disposed on one or more dedicated memory devices or on a processor or other similar device. When functions or steps are said to be "responsive to" or occur "in response to" a function or a process, the device functions or steps necessarily occur as a result of the function or message. It is not sufficient that a function or act merely follow or occur subsequent to another.

The memory 1204 may also store a non-transitory computer code, executable by processor 1202. The computer code may be written in any computer language, such as C, C++, assembly language, channel program code, and/or any combination of computer languages.

The functions, acts or tasks illustrated in the figures or described may be executed in response to one or more sets of logic or instructions stored in or on non-transitory computer readable media as well. The functions, acts or tasks are independent of the particular type of instructions set, storage media, processor or processing strategy and may be performed by software, hardware, integrated circuits, firmware, micro code and the like, operating alone or in combination. In one embodiment, the logic or instructions are stored in a remote location for transfer through a computer network or over wireless or tangible telephone or communication lines.

The wireless sensor detects and measures an event or condition while adapting to internal and external conditions. Using a one-time battery charge, the wireless sensor makes dynamic tradeoffs between its communication schedules and its operating state in response to load, charge rate and/or temperature changes. The wireless sensor adheres to an asynchronous schedule, turning on only when conditions warrant. This is a different approach in the realm of low cost wireless micro-sensors.

The subject-matter of the disclosure may also relate, among others, to the following aspects:

1. A method of managing power in a wireless micro-sensor comprising:
    providing a self-contained energy source through a one-time electrical charge that sources the operation of the wireless micro-sensor's functional lifetime;
    identifying the rated capacity of the self-contained energy course by processing an identification value of the self-contained energy source;
    measuring the temperature of the self-contained energy source over time and determining a temperature trend;
    measuring the depth of discharge of the self-contained energy source; and
    controlling the asynchronous transmission of the micro-sensor in response to the measured temperatures of the self-contained energy source, the temperature trend of the self-contained energy source, and the depth of discharge of the self-contained energy source.

2. The method of claim 1 where controlling the asynchronous transmission comprises controlling the duty cycle sourcing a communication sub-system of the wireless micro-sensor.

3. The method of claim 2 further comprises modulating the duty cycle in response to the depth of discharge exceeding a predetermined threshold.

4. The method of any of claims 2 to 3 further comprises reducing the duty cycle in response to the depth of discharge exceeding a predetermined threshold.

5. The method of any of claims 2 to 4 where the communication sub-system is compliant with a third generation and a fourth generation broadband cellular network protocol standard.

6. The method of any of claims 2 to 5 further comprising increasing the amount of time between wireless transmission events.

7. The method of any of claims 2 to 6 where the control of the duty cycle occurs in response to a hysteresis.

8. The method of any of claims 2 to 7 where the control of the duty cycle occurs in response to a level of degradation of the self-contained energy source.

9. A non-transient computer readable medium storing a program that secures communication across a network, comprising:
    computer program code that identifies the rated capacity of the self-contained energy course by processing an identification value of the self-contained energy source;
    computer program code that measures the temperature of the self-contained energy source over time and determining a temperature trend;
    computer program code that measures the depth of discharge of the self-contained energy source; and
    computer program code that controls the asynchronous transmission of the micro-sensor in response to the measured temperatures of the self-contained energy source, the temperature trend of the self-contained energy source, and the depth of discharge of the self-contained energy source.

10. The non-transient computer readable medium of claim 9 where controlling the asynchronous transmission comprises controlling the duty cycle sourcing a communication sub-system of the wireless micro-sensor.

11. The non-transient computer readable medium of claim 10 further comprises modulating the duty cycle in response to the depth of discharge exceeding a predetermined threshold.

12. The non-transient computer readable medium of any of claims 10 to 11 further comprises reducing the duty cycle in response to the depth of discharge exceeding a predetermined threshold.

13. The non-transient computer readable medium of any of claims 10 to 12 where the communication sub-system is compliant with a third generation and a fourth generation broadband cellular network protocol standard.

14. The non-transient computer readable medium of any of claims 10 to 13 further comprising increasing the amount of time between wireless transmission events.

15. The non-transient computer readable medium of any of claims 10 to 14 where the control of the duty cycle occurs in response to a hysteresis.

16. The non-transient computer readable medium of any of claims 10 to 15 where the control of the duty cycle occurs in response to a level of degradation of the self-contained energy source.

17. A self-configuring wireless micro-sensor, comprising:
    a self-contained energy source that sources the operation of the wireless micro-sensor's functional lifetime through a one-time electrical charge;
    a controller and a memory that controls the wireless micros sensor's operation, timing, and execution of the sensor's communication protocols;
    a transceiver subsystem that enables the wireless micros sensor to communicate with a remote server;
    a sensor subsystem that detects changes in a physical variable; and
    a power subsystem that manages the power to the wireless micro-sensor through the self-contained energy source in response to measured temperatures of the self-contained energy source, a temperature trend of the self-contained energy source, and the depth of discharge of the self-contained energy source.

18. The system of claim 17 where the controller controls asynchronous transmissions from the micro-sensor by controlling the duty cycle sourcing a communication sub-system of the wireless micro-sensor.

19. The system of claim 18 where the controller modulates the duty cycle in response to the depth of discharge exceeding a predetermined threshold.

20. The system of any of claims 18 to 19 where the controller modulates the duty cycle in response to a hysteresis.

Other systems, methods, features and advantages will be, or will become, apparent to one with skill in the art upon examination of the figures and detailed description. It is intended that all such additional systems, methods, features and advantages be included within this description, be within the scope of the disclosure, and be protected by the following claims.

What is claimed is:

1. A method of managing power in a wireless micro-sensor comprising:
    providing a self-contained energy source through a one-time electrical charge that sources the operation of the wireless micro-sensor's functional lifetime;
    identifying the rated capacity of the self-contained energy course by processing an identification value of the self-contained energy source;
    measuring the temperature of the self-contained energy source over time and determining a temperature trend;
    measuring the depth of discharge of the self-contained energy source; and
    controlling the asynchronous transmission of the micro-sensor in response to the measured temperatures of the self-contained energy source, the temperature trend of the self-contained energy source, and the depth of discharge of the self-contained energy source.

2. The method of claim 1 where controlling the asynchronous transmission comprises controlling the duty cycle sourcing a communication sub-system of the wireless micro-sensor.

3. The method of claim 2 further comprises modulating the duty cycle in response to the depth of discharge exceeding a predetermined threshold.

4. The method of claim 2 further comprises reducing the duty cycle in response to the depth of discharge exceeding a predetermined threshold.

5. The method of claim 2 where the communication sub-system is compliant with a third generation and a fourth generation broadband cellular network protocol standard.

6. The method of claim 2 further comprising increasing the amount of time between wireless transmission events.

7. The method of claim 2 where the control of the duty cycle occurs in response to a hysteresis.

8. The method of claim 7 where the control of the duty cycle occurs in response to a level of degradation of the self-contained energy source.

9. A non-transient computer readable medium storing a program that secures communication across a network, comprising:
    computer program code that identifies the rated capacity of the self-contained energy course by processing an identification value of the self-contained energy source;
    computer program code that measures the temperature of the self-contained energy source over time and determining a temperature trend;
    computer program code that measures the depth of discharge of the self-contained energy source; and
    computer program code that controls the asynchronous transmission of the micro-sensor in response to the measured temperatures of the self-contained energy source, the temperature trend of the self-contained energy source, and the depth of discharge of the self-contained energy source.

10. The non-transient computer readable medium of claim 9 where controlling the asynchronous transmission comprises controlling the duty cycle sourcing a communication sub-system of the wireless micro-sensor.

11. The non-transient computer readable medium of claim 10 further comprises modulating the duty cycle in response to the depth of discharge exceeding a predetermined threshold.

12. The non-transient computer readable medium of claim 10 further comprises reducing the duty cycle in response to the depth of discharge exceeding a predetermined threshold.

13. The non-transient computer readable medium of claim 10 where the communication sub-system is compliant with a third generation and a fourth generation broadband cellular network protocol standard.

14. The non-transient computer readable medium of claim 10 further comprising increasing the amount of time between wireless transmission events.

15. The non-transient computer readable medium of claim 10 where the control of the duty cycle occurs in response to a hysteresis.

16. The non-transient computer readable medium of claim 15 where the control of the duty cycle occurs in response to a level of degradation of the self-contained energy source.

17. A self-configuring wireless micro-sensor, comprising:
    a self-contained energy source that sources the operation of the wireless micro-sensor's functional lifetime through a one-time electrical charge;
    a controller and a memory that controls the wireless micros sensor's operation, timing, and execution of the sensor's communication protocols;
    a transceiver subsystem that enables the wireless micros sensor to communicate with a remote server;
    a sensor subsystem that detects changes in a physical variable; and
    a power subsystem that mages the power to the wireless micro-sensor through the self-contained energy source in response to measured temperatures of the self-contained energy source, a temperature trend of the self-contained energy source, and the depth of discharge of the self-contained energy source.

18. The system of claim 17 where the controller controls asynchronous transmission from the micro-sensor by controlling the duty cycle sourcing a communication sub-system of the wireless micro-sensor.

19. The system of claim 18 where the controller modulates the duty cycle in response to the depth of discharge exceeding a predetermined threshold.

20. The system of claim 18 where the controller modulates the duty cycle in response to a hysteresis.

* * * * *